(12) United States Patent
Wang et al.

(10) Patent No.: US 8,971,099 B1
(45) Date of Patent: Mar. 3, 2015

(54) METHOD OF MEASURING THRESHOLD VOLTAGE OF MOS TRANSISTOR IN SRAM ARRAY

(71) Applicants: Semiconductor Manufacturing International (Beijing) Corporation, Beijing (CN); Semiconductor Manufacturing International (Shanghai) Corporation, Shanghai (CN)

(72) Inventors: Yingqian Wang, Shanghai (CN); Yu Li, Shanghai (CN); Yuan Wang, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/229,915

(22) Filed: Mar. 30, 2014

(30) Foreign Application Priority Data

Sep. 17, 2013 (CN) .......................... 2013 1 0425323

(51) Int. Cl.
*G11C 11/00* (2006.01)
*G11C 29/50* (2006.01)
*G11C 11/41* (2006.01)

(52) U.S. Cl.
CPC .......... *G11C 29/50004* (2013.01); *G11C 11/41* (2013.01)

USPC ......................................................... 365/154

(58) Field of Classification Search
USPC ......................................................... 365/154
See application file for complete search history.

(56) References Cited

U.S. PATENT DOCUMENTS

| | | | |
|---|---|---|---|
| 2006/0291291 A1* | 12/2006 | Hosono et al. | 365/185.22 |
| 2007/0053234 A1* | 3/2007 | Tsukada | 365/205 |
| 2008/0144365 A1* | 6/2008 | Yamaoka et al. | 365/181 |
| 2008/0211572 A1* | 9/2008 | Riho | 327/543 |
| 2010/0054063 A1* | 3/2010 | Yoshida | 365/201 |
| 2010/0182844 A1* | 7/2010 | Han | 365/185.22 |
| 2010/0214848 A1* | 8/2010 | Ahn | 365/185.21 |
| 2010/0238728 A1* | 9/2010 | Leung | 365/185.08 |

* cited by examiner

*Primary Examiner* — Harry W Byrne
(74) *Attorney, Agent, or Firm* — Anova Law Group, PLLC

(57) ABSTRACT

Methods of measuring threshold voltages of MOS transistors in a SRAM array are provided. The SRAM array includes array-arranged cells having a first pass NMOS transistor, a second pass NMOS transistor, a first pull-down NMOS transistor, a second pull-down NMOS transistor, a first pull-up PMOS transistor, and a second pull-up transistor. A cell is selected from the SRAM array by a row decoding and a column decoding. A voltage is applied to a word line, a first bit line, a second bit line, a first power line, a second power line, a first substrate terminal, and/or a second substrate terminal, that are connected to the selected cell. A bit line current of the selected cell is measured to obtain a threshold voltage of a MOS transistor in the selected cell. Threshold voltages of a large number of MOS transistors in a SRAM array can be measured.

19 Claims, 4 Drawing Sheets

METHOD OF MEASURING THRESHOLD VOLTAGE OF MOS TRANSISTOR IN SRAM ARRAY

CROSS-REFERENCES TO RELATED APPLICATIONS

This application claims priority to Chinese Patent Application No. CN201310425323.0, filed on Sep. 17, 2013, the entire contents of which are incorporated herein by reference.

FIELD OF THE DISCLOSURE

The present disclosure generally relates to the field of integrated circuit (IC) technology and, more particularly, relates to methods of instant measurement of threshold voltages of MOS transistors in a static random access memory (SRAM) array.

BACKGROUND

As integration level of integrated circuits (ICs) increases and supply voltage decreases, dimensions of semiconductor devices of the ICs shrinks. This requires more improvement in chip manufacturing processes. The performance of semiconductor devices is significantly affected by improvements in chip manufacturing processes. Reliability tests for semiconductor devices are often conducted to evaluate the performance of the semiconductor devices.

Threshold voltage of MOS transistors is an important factor indicating reliability of memories. Currently, wafer acceptance test (WAT) is usually used to obtain the threshold voltage of a MOS transistor in a storage array of static random access memory (SRAM). The basic principle of WAT is to measure test keys on the scribe lines of a wafer to obtain the performance parameters of individual semiconductor devices.

As shown in FIG. 1, a wafer 11 is divided into a plurality of chips 13 by scribe lines 12. Individual semiconductor devices, which are used as test keys, can be formed on the scribe lines 12 when making the chips 13. Referring to FIG. 2, test keys M20 and M21 are located on the scribe lines 12. By measuring the test keys M20 and M21, properties of MOS transistors around the scribe line 12 can be obtained.

When measuring threshold voltage of a PMOS transistor in a SRAM storage array, corresponding DC voltages are applied to bonding pads connected to drain/source of the test key M20 and the substrate. A sweep voltage is applied to a bonding pad connected to the gate of the test key M20. While applying such sweep voltage, a drain current in the test key M20 is measured. A characteristic curve of the measured drain current in the test key M20 versus the gate voltage (i.e., a difference in potential between the gate and the source) can be obtained, and the threshold voltage of the test key M20 can then be calculated according to the characteristic curve.

The threshold voltage of the test key M20 represents the threshold voltage of the PMOS transistor in the SRAM storage array. Similarly, the threshold voltage of an NMOS transistor in the SRAM storage array can also be measured by measuring the threshold voltage of the test key M21.

Accurate assessment of SRAM reliability necessitates a statistic analysis by obtaining threshold voltages of a large number of MOS transistors in the storage array. However, when using WAT to obtain the threshold voltages of the MOS transistors, each test key must be connected to four bonding pads, including bonding pads of the gate, drain, source, and the substrate. Consequently, use of WAT cannot obtain threshold voltages of a desirably large number of MOS transistors in the SRAM array due to limited space of the scribe line 12 for arranging test keys and bonding pads.

BRIEF SUMMARY OF THE DISCLOSURE

One aspect of the present disclosure includes a method of measuring threshold voltages of MOS transistors in a SRAM array. The SRAM array includes array-arranged cells having a first pass NMOS transistor, a second pass NMOS transistor, a first pull-down NMOS transistor, a second pull-down NMOS transistor, a first pull-up PMOS transistor, and a second pull-up transistor. A cell is selected from the SRAM array by a row decoding and a column decoding. A voltage is applied to one or more of a word line, a first bit line, a second bit line, a first power line, a second power line, a first substrate terminal, and a second substrate terminal, that are connected to the selected cell. A bit line current of the selected cell is measured to obtain a threshold voltage of a MOS transistor in the selected cell. The MOS transistor in the selected cell includes the first pass NMOS transistor, the second pass NMOS transistor, the first pull-down NMOS transistor, the second pull-down NMOS transistor, the first pull-up PMOS transistor, or the second pull-up transistor.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The present disclosure provides methods of measuring threshold voltages of a large number of MOS transistors in a storage array. The storage array includes an SRAM storage array. The storage array includes a plurality of storage cells arranged in arrays.

The disclosed methods for measuring threshold voltages of MOS transistors can include, for example, selecting a storage cell from a storage array by row decoding and column decoding; applying voltages to a word line, a first bit line, a second bit line, a first power line, a second power line, a first substrate, and a second substrate of the selected storage cell; and measuring a bit line current of the selected cell to obtain a threshold voltage of a MOS transistor in the selected cell.

For example, when measuring the threshold voltages of the MOS transistors, a storage cell to be measured can be selected. The storage cell to be measured can be selected randomly. For illustration purposes, the storage cell to be measured can be referred to as a target storage cell.

Selection of a target storage cell can include: inputting an address signal of the target storage cell through an address line into a row decoding circuit and a column decoding circuit of the storage array (or storage device), e.g., by applying the address signal of the target storage cell to a bonding pad connected to the address line, and selecting the target storage cell through decoding by the row decoding circuit and the column decoding circuit.

When there are N lines of address lines, by row decoding and column decoding, $2^N$ storage cells can be selected from. A number of N bonding pads can therefore be placed to measure threshold voltages of MOS transistors in the $2^N$ storage cells.

Figure 1:
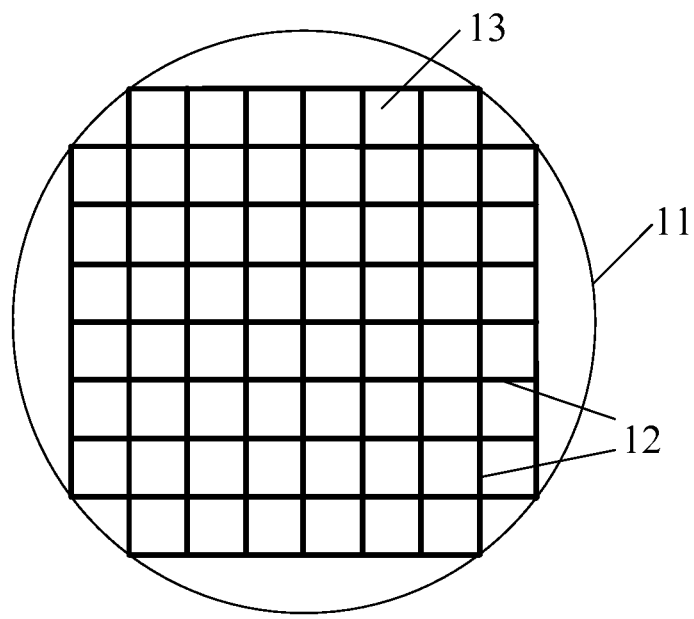
FIG. 1 is a schematic of a wafer structure.
Figure 2:
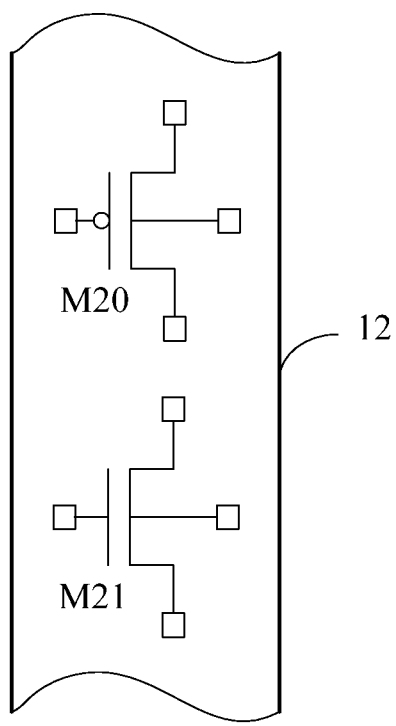
FIG. 2 is a schematic of scribe lines depicted in FIG. 1.
Figure 3:
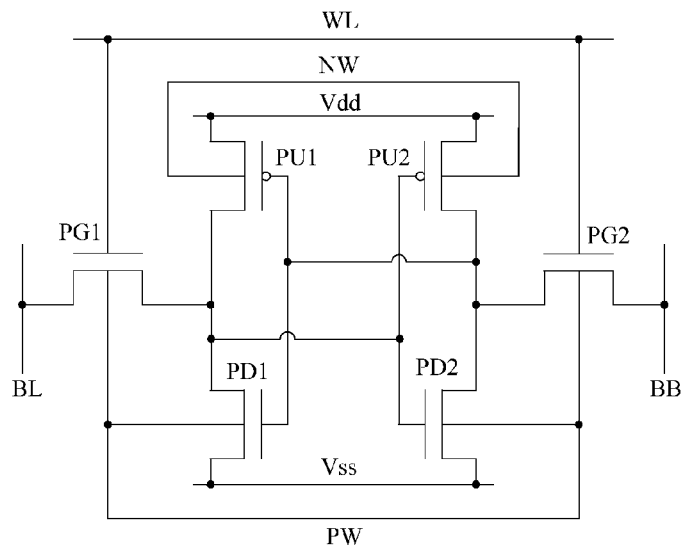
FIG. 3 is a schematic of a cell structure in a storage array in accordance with various disclosed embodiments.

As disclosed, since the storage array can be a SRAM storage array, the target storage cell can include a plurality of MOS transistors. FIG. 3 depicts an exemplary storage cell in accordance with various embodiments. As shown in FIG. 3, the exemplary storage cell includes a first pass NMOS transistor PG1, a second pass NMOS transistor PG2, a first pull-down NMOS transistor PD1, a second pull-down NMOS transistor PD2, a first pull-up PMOS transistor PU1, and a second pull-up PMOS transistor PU2.

A gate electrode of the first pass NMOS transistor PG1 can be connected to a gate electrode of the second pass NMOS transistor PG2 and then further connected to a word line WL. A first electrode of the first pass NMOS transistor PG1 can be connected to a first bit line BL. A second electrode of the first pass NMOS transistor PG1 can be connected to a first electrode of the first pull-up PMOS transistor PU1, a first electrode of the first pull-down NMOS transistor PD1, a gate electrode of the second pull-up PMOS transistor PU2, and a gate electrode of the second pull-down NMOS transistor PD2.

A first electrode of the second pass NMOS transistor PG2 can be connected to a second bit line BB. A second electrode of the second pass NMOS transistor PG2 can be connected to a first electrode of the second pull-up PMOS transistor PU2, a first electrode of the second pull-down NMOS transistor PD2, a gate electrode of the first pull-up PMOS transistor PU1, and a gate electrode of the first pull-down NMOS transistor PD1.

A second electrode of the first pull-up PMOS transistor PU1 can be connected to a second electrode of the second pull-up PMOS transistor PU2 and further be connected to a first supply line Vdd. A second electrode of the first pull-down NMOS transistor PD1 can be connected to a second electrode of the second pull-down NMOS transistor PD2 and further be connected to a second supply line Vss.

Substrates of the first pull-up PMOS transistor PU1 and the second pull-up PMOS PU2 can be connected together to form a first substrate terminal NW. Substrates of the first pass NMOS transistor PG1, the second pass NMOS transistor PG2, the first pull-down NMOS transistor PD1, and the second pull-down NMOS transistor PD2 can be connected together to become a second substrate terminal PW.

When the storage cell shown in FIG. 3 is a target storage cell selected by a row decoding and a column decoding, different test voltages can be applied to measure threshold voltages of different MOS transistors in the target storage cell.

For illustration purposes, the disclosed methods are described herein using the method for measuring a threshold voltage of the first pass NMOS transistor PG1 as an example.

When measuring a threshold voltage of the first pass NMOS transistor PG1, the gate electrodes of both the second pull-down NMOS transistor PD2 and the first pull-down NMOS transistor PD1 are first initialized. For example, the gate electrode of the second pull-down NMOS transistor PD2 (i.e., the second electrode of the first pass NMOS transistor PG1) is initialized to be at low level, and the gate electrode of the first pull-down NMOS transistor PD1 (i.e., the second electrode of the second pass NMOS transistor PG2) is initialized to be at high level.

Specifically, after applying a supply voltage of the storage array to the storage array (i.e., after powering on the storage array), a high level voltage can be applied to the word line WL to switch on (conduct) both the first pass NMOS transistor PG1 and the second pass NMOS transistor PG2. Using a write control circuit, a low level voltage is applied to the first bit line BL, and a high level voltage is applied to the second bit line BB.

The low level voltage applied to the first bit line BL transmits through the first pass NMOS transistor PG1 to the gate electrode of the second pull-down NMOS transistor PD2 to cut off the second pull-down NMOS transistor PD2. The high level voltage applied to the second bit line BB transmits through the second pass NMOS transistor PG2 to the gate electrode of the first pull-down NMOS transistor PD1 to switch on (conduct) the first pull-down NMOS transistor PD1. The initialization process is then completed.

After initializing the gate electrodes of the second pull-down NMOS transistor PD2 and the first pull-down NMOS transistor PD1, the supply voltage of the storage array can be applied to the first power line Vdd, the first substrate terminal NW, the first bit line BL, and the second bit line BB. A zero voltage can be applied to the second power line Vss and the second substrate terminal PW. Voltage of the word line WL can sweep in a pre-set step voltage from 0 V to the supply voltage of the storage array.

During the voltage sweeping of the word line WL, the voltages applied to the first power line Vdd, the first substrate terminal NW, the first hit line BL, the second bit line BB, the second power line Vss, and the second substrate terminal PW are kept unchanged to cut off the first pull-up PMOS transistor PU1, the second pull-up PMOS transistor PU2, and the second pull-down NMOS transistor PD2.

After initialization, a second electrode of the first pass NMOS transistor PG1 is at a low level, and a second electrode of the second pass NMOS transistor PG2 is at a high level. As such, during the voltage sweeping of the word line WL, the first pull-down NMOS transistor PD1 is always "on" to electrically connect the second electrode of the first pass NMOS PG1 with the second power line Vss.

The voltage of the work line WL is the gate voltage of the first pass NMOS transistor PG1. The voltage of the first bit line BL is the drain voltage of the first pass NMOS transistor PG1. The voltage of the second power line Vss is the source voltage of the first pass NMOS transistor PG1.

The voltage applied to the word line WL increases gradually from 0 V, by a pre-set step voltage, to the supply voltage of the storage array. Accordingly, the voltage difference (i.e., the gate-source voltage) between the gate electrode and the source electrode of the first pass NMOS transistor PG1 keeps increasing to switch on the first pass NMOS transistor PG from an "off" state.

The supply voltage of the storage array can range from about 0.5 V to about 2.5V. The pre-set step voltage can range from about 0.005 V to about 0.1 V. In an exemplary embodiment, the supply voltage of the storage array can be about 1 V and the pre-set step voltage can be about 0.02V.

A drain current of the first pass NMOS transistor PG1 (i.e., a current of the first bit line BL) can be measured while the voltage of the word line WL sweeping from 0 V to the supply voltage of the storage array. For example, a corresponding current of the first bit line BL can be measured each time when the voltage of the word line increases, which can be collected either directly using power monitor unit (PMU) or any other suitable devices without limitations.

After drain current data of the first pass NMOS transistor PG1 are collected at different gate-source voltages, a characteristic curve of drain current versus gate-source voltage of the first pass NMOS transistor PG1 can be obtained.

Figure 4:
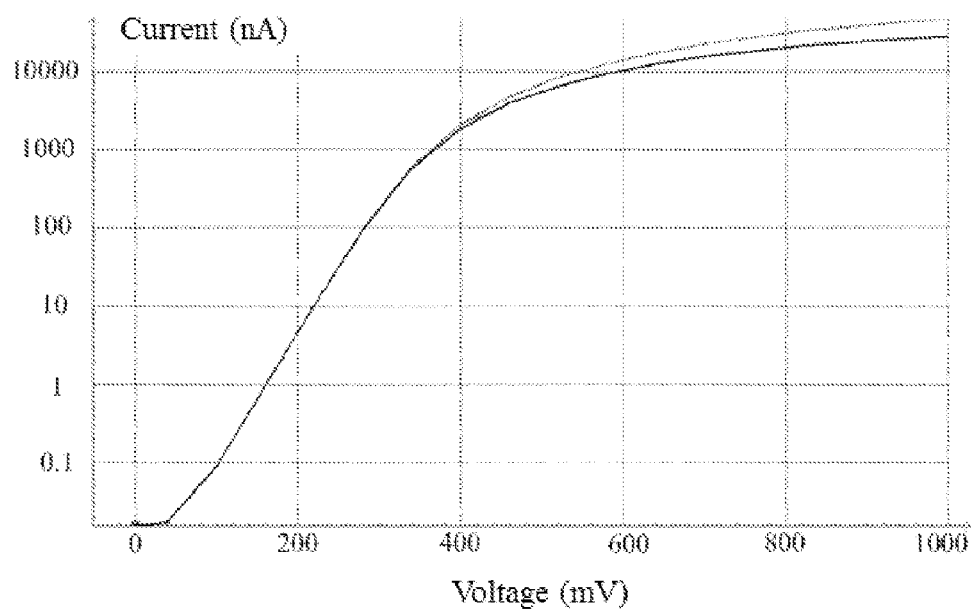
FIG. 4 depicts a plot of a drain current versus a gate voltage of a first pass NMOS transistor in accordance with various disclosed embodiments.

FIG. 4 shows a graph of drain current versus gate-source voltage of the first pass NMOS transistor PG1. In FIG. 4, abscissa having a unit of mV represents the gate-source voltage of the first pass NMOS transistor PG1. Ordinate having a unit of nA represents the drain current of the first pass NMOS transistor PG1. A series of discrete data points can be drawn in FIG. 4 based on the voltages applied to the word line WL and the measured corresponding drain currents of the first pass NMOS transistor PG1. A solid line in FIG. 4 can be obtained by connecting the discrete data points successively. The solid line represents a characteristic curve of drain current versus gate-source voltage of the first pass NMOS transistor PG1.

According to the characteristic curve of the drain current versus gate-source voltage of the first pass NMOS transistor PG1, a threshold voltage of the first pass NMOS transistor PG1 can then be calculated using any suitable approaches without limitations. In an exemplary embodiment, a constant current coefficient method can be used to calculate the threshold voltage of the first NMOS transistor PG1.

First, a constant current Icc of the first pass NMOS transistor PG1 is calculated: Icc=100nA×W/L, where W and L are the width and the length of the first pass NMOS transistor PG1, respectively. After obtaining the constant current Icc, a data point with an ordinate value being equal to the constant current Icc of the first pass NMOS transistor PG1 is then located on the characteristic curve of drain current versus gate-source voltage of the first pass NMOS transistor PG1, and the abscissa value of the data point is taken as the threshold voltage of the first pass NMOS transistor PG1.

Measurements of threshold voltages of MOS transistors provided by this disclosure are performed for a storage cell. A simulation test is conducted for an individual MOS transistor to verify the threshold voltage measured in an exemplary embodiment.

When conducting a simulation test for an individual MOS transistor, the supply voltage of the storage array is applied to a first electrode of the individual MOS transistor, and a zero voltage is applied to a second electrode of the individual MOS transistor. The gate voltage of the individual MOS transistor can sweep from 0 V to the supply voltage of the storage array by a pre-set step voltage, and a drain current (e.g., a current of the first electrode of the individual MOS transistor) of the individual MOS transistor is collected during the voltage sweeping.

The supply voltage of the storage array and the pre-set step voltage are the same as corresponding voltages for testing the first pass NMOS transistor PG1, such that the applied voltage for testing a threshold voltage of the individual MOS transistor is the same as the applied voltage for testing a threshold voltage of the first pass NMOS transistor PG1.

A characteristic curve of drain current versus gate-source voltage of the individual MOS transistor is shown as the dashed line in FIG. 4. As shown in FIG. 4, the solid line and the dashed line are almost or substantially overlapped, e.g., by little differences. In addition, differences between the solid line and the dashed line occur at where a drain current is relatively high, which shows that the differences occur primarily after the MOS transistor is switched on. The differences have little or no effect on the threshold voltage of the MOS transistor. As such, the threshold voltage of the first pass NMOS transistor PG1 measured in this exemplary embodiment is verified to be accurate.

Measurement of a threshold voltage of the second pass NMOS transistor PG2 is disclosed herein. The threshold voltage of the second pass NMOS transistor PG2 can be measured using a similar approach as that for measuring the threshold voltage of the first pass NMOS transistor PG1 but with some distinctions as described as follows. When initializing the gate electrodes of both the second pull-down NMOS transistor PD2 and the first pull-down NMOS transistor PD1, the gate electrode of the second pull-down NMOS transistor PD2 (i.e., a second electrode of the first pass NMOS transistor PG1) is initialized to be at a high level, and the gate electrode of the first pull-down NMOS transistor PD1 (i.e., a second electrode of the second pass NMOS transistor PG2) is initialized to be at a low level. A drain current of the second pass NMOS transistor PG2 can then be obtained by measuring a current of the second bit line BB.

Specifically, after applying a supply voltage to the storage array, a high level voltage is applied to the word line WL to switch on both the first pass NMOS transistor PG1 and the second pass NMOS transistor PG2. A high level voltage and a low level voltage are applied through a write control circuit to the first bit line BL and the second bit line BB, respectively.

The high level voltage applied to the first bit line BL transmits through the first pass NMOS transistor PG1 to the gate electrode of the second pull-down NMOS transistor PD2 to switch on the second pull-down NMOS transistor PD2. The low level voltage applied to the second bit line BB transmits through the second pass NMOS transistor PG2 to the gate electrode of the first pull-down NMOS transistor PD1 to cut off the first pull-down NMOS transistor PD1. Initialization process is then completed.

After initializing the gate electrodes of the second pull-down NMOS transistor PD2 and the first pull-down NMOS transistor PD1, the supply voltage of the storage array can be applied to the first power line Vdd, the first substrate terminal NW, the first bit line BL, and the second bit line BB. A zero voltage can be applied to the second power line Vss and the second substrate terminal PW. Voltage of the word line WL can sweep by a pre-set step voltage from 0 V to the supply voltage of the storage array.

In an exemplary embodiment, the supply voltage of the storage array and the pre-set step voltage can be the same as the corresponding voltages in the aforementioned embodiment for measurement of the threshold voltage of the first pass NMOS transistor PG1.

A drain current of the second pass NMOS transistor PG2 (i.e., a current of the second bit line BB) can be measured while the voltage of the word line WL sweeping from 0 V to the supply voltage of the storage array. After the drain current data of the second pass NMOS transistor PG2 are collected at different gate-source voltages of the second pass NMOS transistor PG2, a characteristic curve of drain current versus gate-source voltage of the second pass NMOS transistor PG2 can be obtained. A threshold voltage of the second pass NMOS transistor PG2 can then be calculated based on the characteristic using a constant current coefficient method.

Measurement of a threshold voltage of the first pull-down NMOS transistor PD1 is disclosed herein. When measuring a threshold voltage of the first pull-down NMOS transistor PD1, no initialization need to be conducted for the gate electrodes of both the second pull-down NMOS transistor PD2 and the first pull-down NMOS transistor PD1. After selecting a target storage cell, the supply voltage of the storage array can be applied to the second power line Vss and the first substrate terminal NW. A zero voltage can be applied to the first bit line BL and the second substrate terminal PW. A control voltage can be applied to the word line WL. The voltages of the second bit line BB and the first power line Vdd can sweep from 0 V to the supply voltage of the storage array by a pre-set step voltage.

The supply voltage of the storage array and the pre-set step voltage are the same as the corresponding voltages in the exemplary embodiment for measuring the threshold voltage of the first pass NMOS transistor (i.e., the supply voltage of the storage array is about 1 V and the pre-set step voltage is about 0.02V). The control voltage is higher than the supply voltage of the storage array, such that the second pass NMOS transistor PG2 can stay at an "on" state when the voltage of the second bit line BB reaches the supply voltage of the storage array. The control voltage can range from about 1V to about 3V. In an exemplary embodiment, the control voltage is about 1.5V.

During the voltage sweeping of the second bit line BB, the voltages applied to the first power line Vdd, the first substrate terminal NW, the first bit line BL, the word line WL, the second power line Vss, and the second substrate terminal PW are all kept unchanged to cut off the first pull-up PMOS transistor PU1, the second pull-up PMOS transistor PU2, and the second pull-down NMOS transistor PD2.

Since the control voltage applied to the word line WL is higher than the supply voltage of the storage array, both the first pass NMOS transistor PG1 and the second pass NMOS transistor PG2 can stay at an "on" state all the time during the voltage sweeping of the second bit line BB. As such, a first electrode of the first pull-down NMOS transistor PD1 can be connected with the first bit line BL, and the gate electrode of the first pull-down NMOS transistor PD1 can be connected with the second bit line BB.

The gate voltage of the first pull-down NMOS transistor PD1 is the voltage of the second bit line BB; the source voltage of the first pull-down NMOS transistor PD1 is the voltage of the first bit line BL; and the drain voltage of the first pull-down NMOS transistor PD1 is the voltage of the second power line Vss.

The voltage applied to the second bit line BB can increase gradually from 0V. Each increased voltage is a pre-set step voltage until the supply voltage of the storage array is reached. Hence, voltage difference (i.e., a gate-source voltage) between the gate electrode and the drain electrode of the first pull-down NMOS transistor PD1 can keep increasing to switch on the first pull-down NMOS transistor PD1 from an "off" state.

A drain current of the first pull-down NMOS transistor PD1 (i.e., a current of the first bit line BL) can be measured while the voltage of the second bit line BB sweeping from 0 V to the supply voltage of the storage array. Specifically, a corresponding current of the first bit line BL can be measured each time when the voltage of the second bit line increases, which can be measured using any suitable methods without limitations (e.g., referring to the exemplary embodiment for measuring a threshold voltage of the first pass NMOS transistor PG1 as discussed above).

Figure 5:
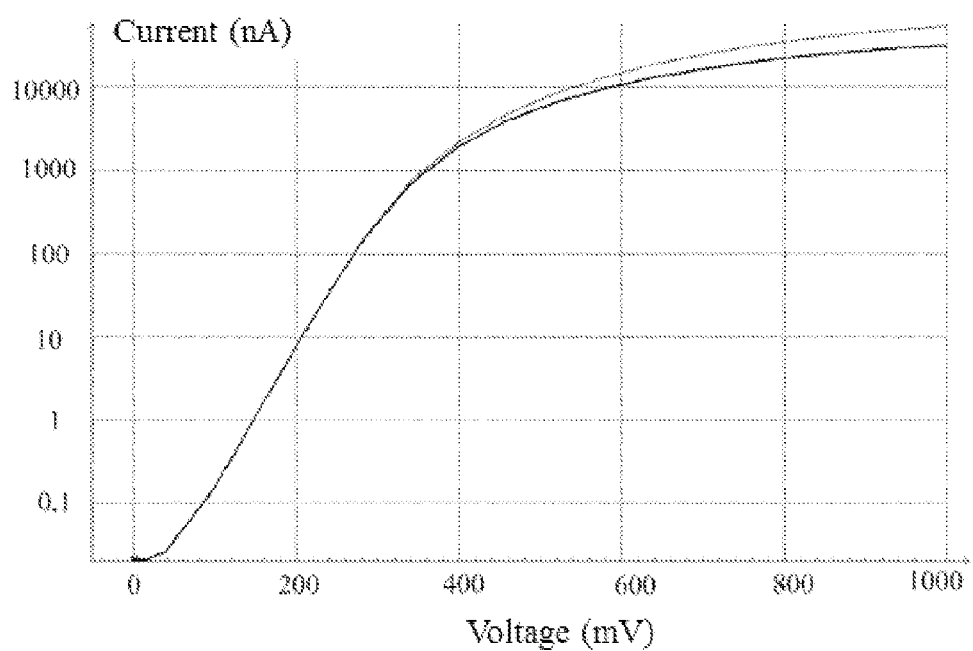
FIG. 5 depicts a plot of a drain current versus a gate voltage of a first pull-down NMOS transistor in accordance with various disclosed embodiments.

FIG. 5 depicts a graph of drain current versus gate-source voltage of the first pull-down NMOS transistor PD1. The solid line in FIG. 5 represents a characteristic curve of drain current versus gate-source voltage of the first pill-down NMOS transistor PD1. A threshold voltage of the first pull-down NMOS transistor PD1 can then be calculated based on the characteristic curve of drain current versus gate-source voltage of the first pull-down NMOS transistor PD1 (e.g., referring to the exemplary embodiment for measuring a threshold voltage of the first pass NMOS transistor PG1).

As depicted in the exemplary embodiment for measuring a threshold voltage of the first pass NMOS transistor PG1, a simulation test is conducted in this exemplary embodiment for an individual MOS transistor. When conducting a simulation test of an individual MOS transistor, the supply voltage of the storage array is applied to a first electrode of the individual MOS transistor, and a zero voltage is applied to a second electrode of the individual MOS transistor. The gate voltage of the individual MOS transistor can sweep from 0 V to the supply voltage of the storage array by a pre-set step voltage, and a drain current (i.e., a current of the first electrode of the individual MOS transistor) of the individual MOS transistor is collected during the voltage sweeping.

The supply voltage of the storage array and the pre-set step voltage are the same as the corresponding voltages for testing a threshold voltage of the first pull-down NMOS transistor PD1, such that the applied voltage for testing a threshold voltage of the individual MOS transistor is the same as the applied voltage for testing a threshold voltage of the first pull-down NMOS transistor PD1.

The dashed line in FIG. 5 represents a characteristic curve of drain current versus gate-source voltage of the individual MOS transistor. As shown in FIG. 5, the solid line and the dashed line are almost or substantially overlapped, e.g., with little differences. In addition, the differences between the solid line and the dashed line occur at where the drain current is relatively high, which shows that the differences occur primarily after the MOS transistor is switched on. The differences have a little or no effect on a threshold voltage of the MOS transistor. As such, the threshold voltage of the first pull-down NMOS transistor PD1 measured in this exemplary embodiment is verified to be accurate.

Disclosed herein is an exemplary embodiment for measuring a threshold voltage of the second pull-down NMOS PD2. A threshold voltage of the second pull-down NMOS transistor PD2 can be measured using a similar approach as that for measuring a threshold voltage of the first pull-down NMOS transistor PD, but with some distinctions as described as follows. The voltages applied to the first bit line BL and the second bit line BB are opposite to the corresponding voltages applied to the first bit line BL and the second bit line BB in the exemplary embodiment for measuring the threshold voltage of the first pull-down NMOS transistor PD1. A drain current of the second pull-down NMOS transistor PD2 can be obtained by measuring a current of the second bit line BB.

Specifically, after selecting a target storage cell, the supply voltage of the storage array can be applied to the second power line Vss and the first substrate terminal NW. A zero voltage can be applied to the second bit line BB and the second substrate terminal PW. A control voltage can be applied to the word line WL. The voltages of the first bit line BL and the first power line Vdd can sweep from 0 V to the supply voltage of the storage array by a pre-set step voltage. The control voltage, the supply voltage of the storage array, and the pre-set step voltage can refer to the exemplary embodiment for measuring a threshold voltage of the first pull-down NMOS transistor PD1

A drain current of the second pull-down NMOS transistor PD2 (i.e., a current of the second bit line BB) can be measured while the voltage of the first bit line BL sweeping from 0 V to the supply voltage of the storage array. Once drain current data of the second pull-down NMOS transistor PD2 are collected at various gate-source voltages, a characteristic curve of drain current versus gate-source voltage of the second pull-down NMOS transistor PD2 can be plotted. A constant current coefficient method can be used to obtain a threshold voltage of the second pull-down NMOS transistor PD2.

Disclosed herein is an exemplary embodiment for measuring a threshold voltage of the first pull-up PMOS transistor PU1. When measuring a threshold voltage of the first pull-up PMOS transistor PU1, no initialization need to be conducted for the gate electrodes of both the second pull-down NMOS transistor PD2 and the first pull-down NMOS transistor PD1. After selection of a target storage cell, the supply voltage of the storage array can be applied to the first bit line BL and the first substrate terminal NW; a zero voltage can be applied to the first power line Vdd and the second substrate terminal PW; and a control voltage can be applied to the word line WL. The voltages of the second bit line BB and the second power line Vss can sweep from the supply voltage of the storage array to 0V by a pre-set step voltage.

The supply voltage of the storage array and the pre-set step voltage are the same as the corresponding voltages in the exemplary embodiment for measuring a threshold voltage of the first pass NMOS transistor (i.e., the supply voltage of the storage array is about 1 V and the pre-set step voltage is about 0.02V). The control voltage is higher than the supply voltage of the storage array, such that the second pass NMOS transistor PG2 can stay at an "on" state when the voltage of the second bit line BB reaches the supply voltage of the storage array. The control voltage can range from about 1V to about 3V. In this exemplary embodiment, the control voltage can be the same as the control voltage applied in the exemplary embodiment for measuring a threshold voltage of the first pull-down NMOS transistor PD1 (i.e., about 1.5V).

During the voltage sweeping of the second bit line BB, the voltages applied to the first power line Vdd, the first substrate terminal NW, the first bit line BL, the word line WL, the second power line Vss, and the second substrate terminal PW are all kept unchanged to cut off the first pull-down NMOS transistor PD1, the second pull-up PMOS transistor PU2, and the second pull-down NMOS transistor PD2.

Since the control voltage applied to the word line WL is higher than the supply voltage of the storage array, both the first pass NMOS transistor PG1 and the second pass NMOS transistor PG2 can stay at an "on" state all the time during the voltage sweeping of the second bit line BB. As such, a first electrode of the first pull-up PMOS transistor PU1 can be connected with the first bit line BL, and the gate electrode of the first pull-up PMOS transistor PU1 can be connected with the second bit line BB.

The gate voltage of the first pull-up PMOS transistor PU1 is the voltage of the second bit line BB; the drain voltage of the first pull-up PMOS transistor PU1 is the voltage of the first bit line BL; and the source voltage of the first pull-up PMOS transistor PU1 is the voltage of the first power line Vdd.

The voltage applied to the second bit line BB can decrease gradually from the supply voltage of the storage array. Each decreased voltage is the pre-set step voltage until a zero voltage is reached. Hence, the voltage difference (i.e., the gate-source voltage) between the gate electrode and the source electrode of the first pull-up PMOS transistor PU1 can keep increasing to switch on the first pull-up PMOS transistor PU1 from an "off" state.

A drain current of the first pull-up PMOS transistor PU1 (i.e., a current of the first bit line BL) can be measured while the voltage of the second bit line BB sweeping from the supply voltage of the storage array to the zero voltage. Specifically, a corresponding current of the first bit line BL can be measured each time when the voltage of the second bit line BB decreases, which can be collected using any suitable methods without limitations (e.g., referring to the exemplary embodiment for measuring a threshold voltage of the first pass NMOS transistor PG1).

Figure 6:
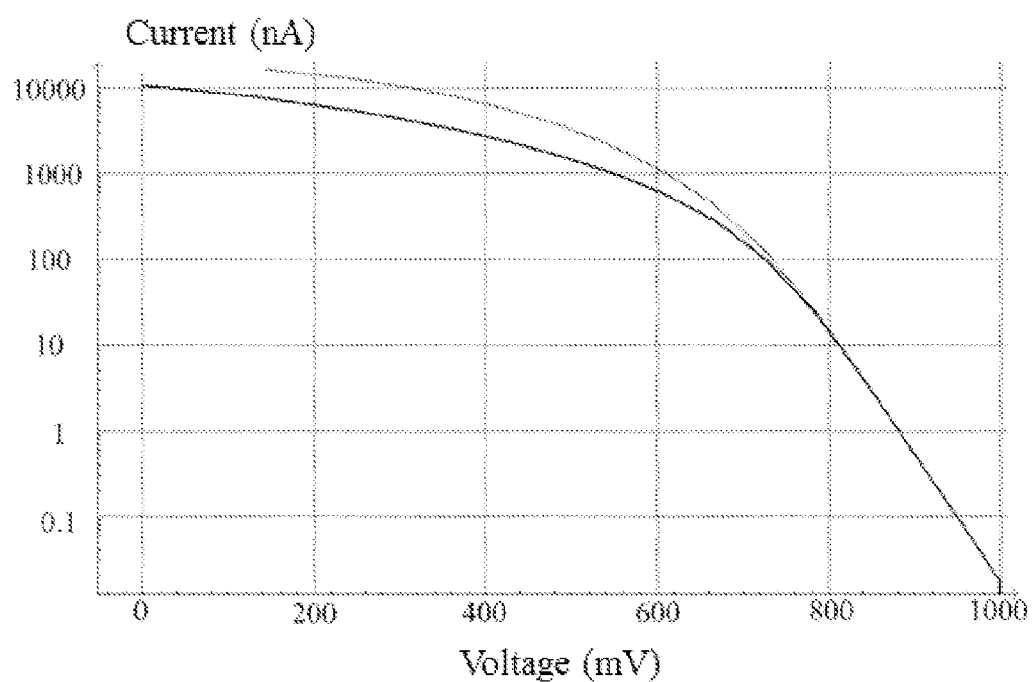
FIG. 6 depicts a plot of a drain current versus a gate voltage of a first pull-up PMOS transistor in accordance with various disclosed embodiments.

FIG. 6 depicts a graph of drain current versus gate-source voltage of the first pull-up PMOS transistor PU1. The solid line in FIG. 6 represents a characteristic curve of drain current versus gate-source voltage of the first pull-up PMOS transistor PU1. The threshold voltage of the first pull-up PMOS transistor PU1 can then be calculated based on the characteristic curve of drain current versus gate-source voltage of the first pull-up PMOS transistor PU1 (e.g., referring to the exemplary embodiment for measuring a threshold voltage of the first pass NMOS transistor PG1).

As depicted in the exemplary embodiment for measuring a threshold voltage of the first pass NMOS transistor PG1, a simulation test is conducted in this exemplary embodiment for an individual MOS transistor. When conducting a simulation test of an individual MOS transistor, the supply voltage of the storage array is applied to a first electrode of the individual MOS transistor, and a zero voltage is applied to a second electrode of the individual MOS transistor. The gate voltage of the individual MOS transistor can sweep from the supply voltage of the storage array to the zero voltage in a pre-set step voltage. A drain current (i.e., a current of the first electrode of the individual MOS transistor) of the individual MOS transistor is collected during the voltage sweeping.

The supply voltage of the storage array and the pre-set step voltage are the same as the corresponding voltages for testing a threshold voltage of the first pull-up PMOS transistor PU1, such that the applied voltage for testing a threshold voltage of the individual MOS transistor is the same as the applied voltage for testing a threshold voltage of the first pull-up PMOS transistor PU1.

The dashed line in FIG. 6 depicts a characteristic curve of drain current versus gate-source voltage of the individual MOS transistor. As shown in FIG. 6, the solid line and the dashed line are almost or substantially overlapped, e.g., with little differences. In addition, differences between the solid line and the dashed line occur at where the drain current is relatively high, which shows that the differences occur primarily after the MOS transistor is switched on. The differences have a little or no effect on the threshold voltage of the MOS transistor. As such, the threshold voltage of the first pull-up PMOS transistor PU1 measured in this exemplary embodiment is verified to be accurate.

Disclosed herein is an exemplary embodiment for measuring a threshold voltage of the second pull-up PMOS transistor PU2. A threshold voltage of the second pull-up PMOS transistor PU2 can be measured using a similar approach as that for measuring a threshold voltage of the first pull-up PMOS transistor PU1, but with some distinctions as described as follows. For the second pull-up PMOS transistor PU2, the voltages applied to the first bit line BL and the second bit line BB can be opposite to corresponding voltages applied in the exemplary embodiment for measuring a threshold voltage of the first pull-up PMOS transistor PU1; and a drain current of the second pull-up PMOS transistor PU2 can be obtained by measuring a current of the second bit line BB.

Specifically, after selection of a target storage cell, the supply voltage of the storage array can be applied to the second bit line BB and the first substrate terminal NW; a zero voltage can be applied to the first power line Vdd and the second substrate terminal PW; and a control voltage can be applied to the word line WL. The voltages of the first bit line BL and the second power line Vss can sweep from the supply voltage of the storage array to 0V by a pre-set step voltage.

The control voltage, the supply voltage of the SRAM array, and the pre-set step voltage can be referred to the exemplary embodiment for measuring a threshold voltage of the first pull-down NMOS transistor PD1.

A drain current of the second pull-up PMOS transistor PU2 (i.e., a current of the second bit line BB) can be measured while the voltage of the first bit line BL sweeping from the supply voltage of the storage array to the zero voltage. Once drain current data of the second pull-up PMOS transistor PU2 can be collected at various gate-source voltages, a characteristic curve of drain current versus gate-source voltage of the second pull-up PMOS transistor PU2 can be plotted. A constant current coefficient method can be used to calculate the threshold voltage of the second pull-up PMOS transistor PU2.

In this manner, the disclosure provides methods of measuring a threshold voltage of a MOS transistor, e.g., by directly measuring threshold voltages of MOS transistors in a storage array, without positioning test keys on the scribe lines of a wafer. Only bonding pads connected to the word line, the first bit line, the second bit line, the first power line, the second power line, the first substrate, the second substrate, and address lines of the storage array are need to be placed on the scribe lines of the wafer. Further, when the address line connects to a number of N bonding pads, $2^N$ storage cells in the storage array can be selected for measurement by a row decoding and a column decoding to collect threshold voltages of about a number of $6 \times 2^N$ MOS transistors. Methods disclosed for measuring threshold voltages of MOS transistors in a storage array can measure a large number of MOS transistors in the storage array.

Table. 1 illustrates threshold voltages of MOS transistors of ten failed storage cells measured in accordance with various disclosed embodiments. The ten failed storage cells are labeled as cells 1-10. The failed threshold voltages are identified, as shown in Table 1.

TABLE 2

|  | PG1 | PG2 | PD1 | PD2 | PU1 | PU2 |
|---|---|---|---|---|---|---|
| Cell 9 | 0.479 | 0.614 | 0.799 | 0.483 | 0.586 | 0.595 |

To evaluate measurement accuracy of methods provided by the disclosure, a nanoprobe method with a high accuracy is employed to measure the failed storage cell 9. Table 2 illustrates a threshold voltage of a MOS transistor of the failed storage cell 9 in Table 1 measured by the nanoprobe method, which shows a high agreement between the threshold voltage of the MOS transistor measured by the disclosed methods and the threshold voltage of the same MOS transistor measured by the nanoprobe method. The nanoprobe method has high measurement accuracy for measuring a threshold voltage of a MOS transistor. However, the nanoprobe method has a slow measurement rate with a high cost, and needs to expose electrodes of a MOS transistor prior to measurement. The nanoprobe method can also damage a wafer. In contrast, methods provided by the present disclosure have a fast measurement rate with a low cost, and do not require electrodes of a MOS transistor to be exposed prior to measurement. Also methods disclosed herein do not damage a wafer.

TABLE 1

|  | PG1 | PG2 | PD1 | PD2 | PU1 | PU2 |
|---|---|---|---|---|---|---|
| Cell 1 | 0.85 | 0.663 | 0.55 | 0.488 | 0.569 | 0.625 |
| Cell 2 | 0.875 | 0.613 | 0.488 | 0.519 | 0.513 | 0.663 |
| Cell 3 | 0.844 | 0.65 | 0.588 | 0.488 | 0.544 | 0.706 |
| Cell 4 | 0.875 | 0.594 | 0.625 | 0.506 | 0.525 | 0.6 |
| Cell 5 | 0.856 | 0.644 | 0.55 | 0.488 | 0.525 | 0.65 |
| Cell 6 | 0.713 | 0.856 | 0.506 | 0.581 | 0.675 | 0.6 |
| Cell 7 | 0.594 | 0.875 | 0.513 | 0.6 | 0.613 | 0.569 |
| Cell 8 | 0.35 | 0.725 | 0.581 | 0.369 | 0.656 | 0.675 |
| Cell 9 | 0.5 | 0.606 | 0.794 | 0.438 | 0.638 | 0.675 |
| Cell 10 | 0.844 | 0.569 | 0.581 | 0.494 | 0.519 | 0.619 |

In this manner, threshold voltages of other MOS transistors in the SRAM array can be obtained (e.g., the second pass NMOS transistor, the first pull-down NMOS transistor, the second pull-down NMOS transistor, the first PMOS transistor, and the second pull-up PMOS transistor). The pre-set step voltage can range from about 0.005 V to about 0.1 V. The supply voltage of the SRAM array can range from about 0.5 V to about 2.5 V. The control voltage can range from about 1 V to about 3 V.

Advantages of the disclosure over conventional measurements can include a direct measurement of threshold voltages of MOS transistors in the SRAM array without positioning test keys on the scribe line of wafer. Only bonding pads connecting to the word line, the first bit line, the second bit line, the first power line, the second power line, the first substrate, the second substrate, and the address line of the SRAM array are required to be placed on the scribe line. Further, when the address line connects to a number of N pads, about $2^N$ cells in the SRAM array can be selected for measurement through row decoding and column decoding to collect a large number of threshold voltages of MOS transistors in the SRAM array. Additionally, the disclosed measurement method provides no exposure of MOS transistor terminals, no damage to the wafer, and is a fast and low-cost method for threshold voltage measurement of MOS transistors.

Other applications, advantages, alternations, modifications, or equivalents to the disclosed embodiments are obvious to those skilled in the art.

What is claimed is:
1. A method of measuring threshold voltages of MOS transistors in a SRAM array, comprising:
  providing the SRAM array including array-arranged cells each including a first pass NMOS transistor, a second pass NMOS transistor, a first pull-down NMOS transistor, a second pull-down NMOS transistor, a first pull-up PMOS transistor, and a second pull-up transistor;
  selecting a cell from the SRAM array by a row decoding and a column decoding;
  applying a voltage to one or more of a word line, a first bit line, a second bit line, a first power line, a second power line, a first substrate terminal, and a second substrate terminal, that are connected to the selected cell; and
  measuring a bit line current of the selected cell to obtain a threshold voltage of a MOS transistor in the selected cell, wherein the MOS transistor in the selected cell includes the first pass NMOS transistor, the second pass NMOS transistor, the first pull-down NMOS transistor, the second pull-down NMOS transistor, the first pull-up PMOS transistor, or the second pull-up transistor.

2. The method according to claim 1, wherein measuring a threshold voltage of the first pass NMOS transistor includes:
   initializing a gate electrode of the second pull-down NMOS transistor to be at a low level and a gate electrode of the first pull-down NMOS transistor to be at a high level;
   after initializing, applying a supply voltage of the SRAM array to the first power line, the first substrate terminal, the first bit line, and the second bit line,
   applying a zero voltage to the second power line and the second substrate terminal;
   sweeping a voltage of the word line from zero to the supply voltage of the SRAM array by a pre-set step voltage; and
   measuring a current of the first bit line when sweeping the voltage.

3. The method according to claim 2, wherein the pre-set step voltage ranges from about 0.005 V to about 0.1 V.

4. The method according to claim 2, wherein the supply voltage of the SRAM array ranges from about 0.5 V to about 2.5 V.

5. The method according to claim 2, wherein the control voltage ranges from about 1V to about 3V.

6. The method according to claim 1, wherein measuring a threshold voltage of the second pass NMOS transistor includes:
   initializing a gate electrode of the first pull-down NMOS transistor to be at a low level and a gate electrode of the second pull-down NMOS transistor to be at a high level;
   after initializing, applying a supply voltage of the SRAM array to the first power line, the first substrate terminal, the first bit line, and the second bit line;
   applying a zero voltage to the second power line and the second substrate terminal;
   sweeping a voltage of the word line from zero to the supply voltage of the SRAM array by a pre-set step voltage; and
   measuring a current of the second bit line during the voltage sweeping.

7. The method according to claim 1, wherein measuring a threshold voltage of the first pill-down NMOS transistor includes:
   applying a supply voltage of the SRAM array to the second power line and the first substrate terminal,
   applying a zero voltage to the first bit line and the second substrate terminal;
   applying a control voltage to the word line;
   sweeping voltages of the second bit line and the first power line from 0 V to the supply voltage of the SRAM array by a pre-set step voltage; and
   measuring a drain current of the first bit line while the voltages of the second bit line and the first power line sweeping from 0 V to the supply voltage of the SRAM array.

8. The method according to claim 7, wherein the control voltage is higher than the supply voltage of the SRAM array.

9. The method according to claim 7, wherein the pre-set step voltage ranges from about 0.005 V to about 0.1 V.

10. The method according to claim 7, wherein the supply voltage of the SRAM array ranges from about 0.5 V to about 2.5 V.

11. The method according to claim 7, wherein the control voltage ranges from about 1V to about 3V.

12. The method according to claim 1, wherein measuring a threshold voltage of the second pull-down NMOS transistor includes:
   applying a supply voltage of the SRAM array to the second power line and the first substrate terminal,
   applying a zero voltage to the second bit line and the second substrate terminal;
   applying a control voltage to the word line;
   sweeping voltages of the first bit line and the first power line from 0 V to the supply voltage of the SRAM array by a pre-set step voltage; and
   measuring a drain current of the first bit line, while the voltages of the first bit line and the first power line sweeping from 0 V to the supply voltage of the SRAM array.

13. The method according to claim 12, wherein the control voltage is higher than the supply voltage of the SRAM array.

14. The method according to claim 1, wherein measuring a threshold voltage of the first pull-up NMOS transistor includes:
   applying a supply voltage of the SRAM array to the first bit line and the first substrate terminal,
   applying a zero voltage to the first power line and the second substrate terminal;
   applying a control voltage to the word line;
   sweeping voltages of the second bit line and the second power line from the supply voltage of the SRAM array to zero voltage by a pre-set step voltage; and
   measuring a drain current of the first bit line, while the voltages of the second bit line and the second power line sweeping from the supply voltage of the SRAM array to zero voltage.

15. The method according to claim 1, wherein measuring a threshold voltage of the second pull-up NMOS transistor includes:
   applying a supply voltage of the SRAM array to the second bit line and the first substrate terminal,
   applying a zero voltage to the first power line and the second substrate terminal;
   applying a control voltage to the word line;
   sweeping voltages of the first bit line and the second power line from the supply voltage of the SRAM array to zero voltage by a pre-set step voltage; and
   measuring a drain current of the second bit line, while the voltages of the first bit line, and the second power line sweeping from the supply voltage of the SRAM array to zero voltage.

16. The method according to claim 15, wherein the control voltage is higher than the supply voltage of the SRAM array.

17. The method according to claim 15, wherein the pre-set step voltage ranges from about 0.005 V to about 0.1 V.

18. The method according to claim 15, wherein the supply voltage of the SRAM array ranges from about 0.5 V to about 2.5 V.

19. The method according to claim 15, wherein the control voltage ranges from about 1V to about 3V.

* * * * *